(12) United States Patent
Fachmann et al.

(10) Patent No.: US 9,349,795 B2
(45) Date of Patent: May 24, 2016

(54) SEMICONDUCTOR SWITCHING DEVICE WITH DIFFERENT LOCAL THRESHOLD VOLTAGE

(71) Applicant: Infineon Technologies Austria AG, Villach (AT)

(72) Inventors: Christian Fachmann, Fuernitz (AT); Enrique Vecino Vazquez, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/310,011

(22) Filed: Jun. 20, 2014

(65) Prior Publication Data

US 2015/0372086 A1    Dec. 24, 2015

(51) Int. Cl.
*H01L 29/66* (2006.01)
*H01L 29/06* (2006.01)
(Continued)

(52) U.S. Cl.
CPC ............ *H01L 29/0696* (2013.01); *H01L 21/22* (2013.01); *H01L 21/283* (2013.01); *H01L 21/8249* (2013.01); *H01L 27/0635* (2013.01); *H01L 29/0634* (2013.01);
(Continued)

(58) Field of Classification Search
CPC .................. H01L 2924/0002; H01L 2924/00; H01L 23/481; H01L 29/0623; H01L 29/0634; H01L 29/0653; H01L 29/0696; H01L 29/1095; H01L 29/42372; H01L 29/4238; H01L 29/7811; H01L 29/7813; H01L 29/7455
USPC ......... 257/132, 618, 263, 139–140, 330, 296, 257/340, 77, 691; 326/63; 345/89, 690
See application file for complete search history.

(56) References Cited

U.S. PATENT DOCUMENTS 5,121,176 A * 6/1992 Quigg ............... H01L 29/42368
257/145
5,146,426 A * 9/1992 Mukherjee .......... H01L 29/7885
257/261

(Continued)

FOREIGN PATENT DOCUMENTS

| DE | 19808348 C1 | 6/1999 |
| DE | 10246960 A1 | 4/2004 |
| EP | 0293846 A1 | 12/1988 |

OTHER PUBLICATIONS

"Microelectronic Circuits" fourth edition by Adel S. Sedra and Kenneth C. Smith, Oxford University Press, 1982, pp. 356, 368-369.*

*Primary Examiner* — Mohammed Shamsuzzaman
(74) *Attorney, Agent, or Firm* — Murphy, Bilak & Homiller, PLLC (57) ABSTRACT

A semiconductor device includes a semiconductor substrate having a plurality of switchable cells defining an active area of the semiconductor device, an outer rim, and an edge termination region arranged between the switchable cells and the outer rim. Each of the switchable cells includes a body region, a gate electrode structure and a source region. A source metallization is in ohmic contact with the source regions of the switchable cells. A a gate metallization is in ohmic contact with the gate electrode structures of the switchable cells. The active area defined by the switchable cells includes at least a first switchable region having a first threshold and at least a second switchable region having a second threshold which is higher than the first threshold. An area assumed by the first switchable region is larger than an area assumed by the second switchable region.

19 Claims, 8 Drawing Sheets

(51) Int. Cl.
*H01L 29/739* (2006.01)
*H01L 29/417* (2006.01)
*H01L 29/423* (2006.01)
*H01L 29/10* (2006.01)
*H01L 21/283* (2006.01)
*H01L 21/22* (2006.01)
*H01L 27/06* (2006.01)
*H01L 21/8249* (2006.01)
*H01L 29/78* (2006.01)

(52) U.S. Cl.
CPC ....... *H01L 29/1041* (2013.01); *H01L 29/1095* (2013.01); *H01L 29/41741* (2013.01); *H01L 29/4232* (2013.01); *H01L 29/66333* (2013.01); *H01L 29/66666* (2013.01); *H01L 29/66712* (2013.01); *H01L 29/7395* (2013.01); *H01L 29/7811* (2013.01); *H01L 29/7827* (2013.01)

(56) References Cited

U.S. PATENT DOCUMENTS

| | | | |
|---|---|---|---|
| 5,451,807 A * | 9/1995 | Fujita | H01L 29/1045 257/344 |
| 6,097,214 A * | 8/2000 | Troussel | G09G 3/26 326/63 |
| 6,271,562 B1 | 8/2001 | Deboy et al. | |
| 6,653,691 B2 * | 11/2003 | Baliga | H01L 23/552 257/328 |
| 6,872,990 B1 | 3/2005 | Kang | |
| 6,882,005 B2 * | 4/2005 | Disney | H01L 29/402 257/300 |
| 6,924,532 B2 | 8/2005 | Pfirsch et al. | |
| 7,939,882 B2 * | 5/2011 | Su | H01L 21/8234 257/328 |
| 8,680,610 B2 | 3/2014 | Hsieh | |
| 2001/0054760 A1 * | 12/2001 | Ito | H01L 23/50 257/691 |
| 2002/0056872 A1 * | 5/2002 | Baliga | H01L 23/552 257/330 |
| 2002/0093033 A1 | 7/2002 | Zommer et al. | |
| 2002/0168821 A1 * | 11/2002 | Williams | H01L 27/0255 438/268 |
| 2004/0113179 A1 | 6/2004 | Pfirsch et al. | |
| 2004/0232484 A1 | 11/2004 | Zommer et al. | |
| 2004/0246219 A1 * | 12/2004 | Moon | G09G 3/3648 345/89 |
| 2008/0265289 A1 | 10/2008 | Bhalla et al. | |
| 2009/0213148 A1 * | 8/2009 | Takasugi | G09G 3/3233 345/690 |
| 2010/0025748 A1 * | 2/2010 | Mauder | H01L 21/26513 257/296 |
| 2011/0163373 A1 | 7/2011 | Arzumanyan et al. | |
| 2013/0020635 A1 * | 1/2013 | Yilmaz | H01L 27/088 257/334 |
| 2013/0207101 A1 * | 8/2013 | Yamazaki | H01L 29/41733 257/43 |
| 2013/0240955 A1 * | 9/2013 | Hirler | H01L 23/481 257/263 |
| 2013/0320487 A1 * | 12/2013 | Mauder | H01L 29/861 257/509 |
| 2013/0334597 A1 | 12/2013 | Yamashita et al. | |
| 2013/0341673 A1 * | 12/2013 | Pfirsch | H01L 29/404 257/139 |
| 2013/0341674 A1 * | 12/2013 | Werber | H01L 29/32 257/140 |
| 2014/0015592 A1 * | 1/2014 | Weis | H01L 27/0886 327/430 |
| 2014/0197477 A1 | 7/2014 | Onishi | |
| 2014/0374882 A1 * | 12/2014 | Siemieniec | H01L 21/324 257/618 |
| 2015/0001549 A1 * | 1/2015 | Miura | H01L 29/0603 257/76 |
| 2015/0115286 A1 * | 4/2015 | Takeuchi | H01L 21/8213 257/77 |
| 2015/0162407 A1 * | 6/2015 | Laven | H01L 29/1095 257/139 |

\* cited by examiner

SEMICONDUCTOR SWITCHING DEVICE WITH DIFFERENT LOCAL THRESHOLD VOLTAGE

TECHNICAL FIELD

Embodiments described herein relate to semiconductor devices and in particular to semiconductor switching devices such as semiconductor power switches having locally different threshold voltages.

BACKGROUND

Semiconductor switching devices having large chip area are provided with gate signal emitters or gate runner structures such as gate pads, gate rings, or gate fingers for transferring an external switching signal provided by external circuitry to an ensemble of switchable cells arranged in an active area of the semiconductor switching device.

Cells located at or in the proximity of an outer rim of the chip area where the gate metallization is located, can receive an external switching signal at a time before the external switching signal can reach switchable cells located in an inner region of the chip area. In particular, if a transient switching signal for a short duration occurs, only those cells close to gate signal emitters are addressed, and thus switched. The cells close to the gate signal emitters must therefore carry the full load current which can result in a current per cell higher than the rated current. Furthermore, this kind of inhomogeneous distribution of the external switching signal across the chip area can prevent the switchable cells from switching concurrently. Simultaneous operation of the switchable cells is thus not ensured and inhomogeneous switching can occur.

In view of the above, there is a need for improvement.

SUMMARY

According to an embodiment, a semiconductor device includes a semiconductor substrate having a plurality of switchable cells defining an active area of the semiconductor device, an outer rim, and an edge termination region arranged between the switchable cells and the outer rim. Each of the switchable cells includes a body region, a gate electrode structure and a source region. A source metallization is in ohmic contact with the source regions of the switchable cells. A gate metallization is in ohmic contact with the gate electrode structures of the switchable cells. The active area defined by the switchable cells includes at least a first switchable region having a first threshold and at least a second switchable region having a second threshold which is higher than the first threshold, wherein an area assumed by the first switchable region is larger than an area assumed by the second switchable region.

According to an embodiment, a semiconductor device includes a semiconductor substrate having a plurality of switchable cells defining an active area of the semiconductor device, an outer rim, and an edge termination region arranged between switchable cells and the outer rim. Each of the switchable cells includes a body region, a gate electrode structure and a source region. The body region includes a channel region next to the gate electrode structure. A source metallization is in ohmic contact with the source regions of the switchable cells. A gate metallization is in ohmic contact with the gate electrode structures of the switchable cells. The active area defined by the switchable cells includes at least a first switchable region and a second switchable region different to the first switchable region, wherein portions of the channel regions of the switchable cells arranged in the first switchable region have a doping concentration which is lower than a doping concentration of portions of the channel regions of the switchable cells arranged in the second switchable region.

According to an embodiment, a method for manufacturing a semiconductor device includes: providing a semiconductor substrate having an outer rim, an active area, and an edge termination region arranged between the active area and the outer rim; forming a plurality of switchable cells in the active area, wherein each of the switchable cells comprises a body region, a gate electrode structure, and a source region, wherein the active area defined by the switchable cells includes at least a first switchable region having a first threshold and at least a second switchable region having a second threshold which is higher than the first threshold, wherein an area assumed by the first switchable region is larger than an area assumed by the second switchable region; forming a source metallization in ohmic contact with the source regions of the switchable cells; and forming a gate metallization in ohmic contact with the gate electrode structures of the switchable cells.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts.

DETAILED DESCRIPTION

In the following Detailed Description, reference is made to the accompanying drawings, which form a part hereof, and in which are shown by way of illustration specific embodiments in which the invention can be practiced. In this regard, directional terminology, such as "top," "bottom," "front," "back," "leading," "trailing," "lateral," "vertical," etc., is used with reference to the orientation of the Figure(s) being described. Because components of embodiments can be positioned in a number of different orientations, the directional terminology is used for purpose of illustration and is in no way limiting. It is to be understood that other embodiments can be utilised and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The threshold voltage, commonly abbreviated as Vth, of a field-effect transistor (FET) is the value of the gate-source voltage at which the conductive properties of the FET significantly changes, either from non-conductive to conductive in case of enhancement devices or from conductive to non-conductive with increasing gate-source voltage in case of depletion devices. The threshold voltage is also referred to as pinch-off voltage. For enhancement devices, an inversion channel is formed in the channel region of the body region next to the dielectric region or dielectric layer when the voltage between the gate electrode and the source region is above the threshold voltage Vth. At the threshold voltage, the channel region formed in the body region begins to establish an ohmic connection between the source and drain contacts of the transistor. Below this threshold voltage, the FET is non-conductive. Thus, the threshold voltage Vth often refers to the minimum gate voltage necessary for the onset of a unipolar current flow between the two semiconductor regions of the first conductivity type, which form the source and the drift or drain of a transistor structure.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a location of a structural feature relative to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to also include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as Metal Oxide Semiconductor Field-effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on FET, e.g., the source-drain voltage is desired to be low. On the other hand, the losses occurring during switching off or commutating of the FET are often also to be kept small to minimize the overall losses.

The term "semiconductor power switch" as used in this specification describes a semiconductor device on a single chip with high voltage and/or high current switching capabilities. In other words, power semiconductor devices are intended for high current, typically in the Ampere range. Within this specification the terms "semiconductor power switch," "semiconductor switching device," and "power semiconductor device" are used synonymously.

In the context of the present specification, the term "active cell region" or "active area" describes a region of a semiconductor substrate of the semiconductor switching device where switchable cells which carry the load current are arranged. The switchable cells in the active area define the switching behavior of the semiconductor switching device. Specifically, an active area can include at least a main or first switchable region and a second switchable region, optionally more than two different switchable regions. Switchable cells in different switchable regions can differ from each other in at least one physical property such as the gate-drain capacitance or the threshold voltage. The different switchable regions of the active area are also referred to as "sub-regions" of the active area and describe regions having switchable cells, or portions of switchable cells, with physical properties which are different to the physical properties of switchable cells of other sub-regions. In particular, different sub-regions can be manufactured with different threshold voltages such that the threshold voltage of an individual cell or a group of individual cells of a specific sub-region is different to the threshold voltage of an individual cell or a group of individual cells of another specific sub-region.

In the context of the present specification, the term "cell pitch" or "longitudinal pitch" describes the pitch of the switchable cells in the active area.

In the context of the present specification, the term "gate electrode structure" describes a conductive structure which is arranged next to, and insulated from the semiconductor substrate by a dielectric region or dielectric layer. The gate electrode structure covers, when seen onto the surface of the semiconductor substrate, different regions of the semiconductor device such as body regions and drift regions. The gate electrode structure includes the gate electrodes of the switchable cells next to the body regions and also electrical connections between adjacent gate electrodes which are electrically connected with each other. The gate electrodes are configured to form and/or control the conductivity of a channel region in the body region, for example by the electric-field-mediated formation of an "inversion channel" in the body regions between the respective source regions and drift regions of the switchable cells. When forming an inversion channel, the conductivity type of the channel region is typically changed, i.e., inverted, to form an unipolar current path between the source and the drain region. The gate electrode structure is often conveniently referred to as gate polysilicon.

Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$), and combinations thereof including stacks of different insulating materials.

The terms "electrical connection" and "electrically connected" describes an ohmic connection between two elements.

In the context of the present specification, the term "gate signal emitter" describes an electrode configuration which provides transfer of external switching signals to the gate electrode structure of the switchable cells. Within this specification the terms "gate metallization" and "gate signal emitter" are used synonymously. Typically, the gate metallization is formed on the gate electrode structure to improve distribution of the switching signal. For example, the gate electrode structure is formed by polysilicon and can have a net-like structure covering the active area while the gate metallization is formed on and in ohmic contact with the gate electrode structure in the periphery of the semiconductor device, for example, in the edge termination area. The gate metallization can include, for example, a gate ring, or a gate ring and gate fingers extending from the gate ring into the active area. The net-like structure of the gate electrode structure includes openings for source plugs or source contacts. Gate signal emitters typically have a lower specific resistance than the gate electrode structure. For example, gate signal emitters can be made of a more conductive material than the gate electrode structure and/or can be made thicker than the gate electrode structure to reduce the resistance.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

When describing switchable cells to be closer to the gate metallization, this can refer either to a geometrical distance of the respective switchable cell to the gate metallization, or to the electrical value of the gate resistance that this switchable cell has. For example, the closer the switchable cell is arranged to the gate metallization, the lower is its gate resistance. As the resistance of the gate structure also varies depending on the layout of the switchable cells arranged between the gate metallization and a particular switchable cell, the gate resistance of two specific switchable cells can be different even when both have the same geometrical distance to the gate metallization. Therefore, "closer to the gate metallization" describes, when using the picture of electrical resistance, that a particular switchable cell has a lower gate resistance than another particular switchable cell.

Figure 1:
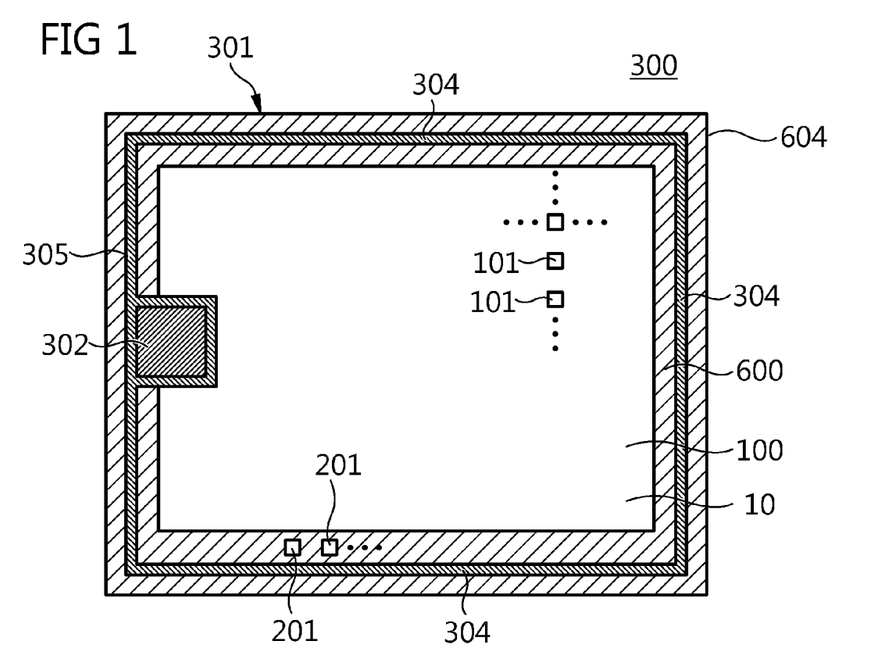
FIG. 1 illustrates a semiconductor switching device having a main cell region which is surrounded by an edge termination region, according to an embodiment.

With reference to FIG. 1, a first embodiment of a semiconductor switching device 300 having a plurality of switchable cells 101 provided in a semiconductor substrate 301 is described. The semiconductor switching device 300 has an active area 10 with a main or first switchable region 100 which is surrounded by an edge termination region 600.

The semiconductor substrate 301 includes an outer rim 604, the active area 10, and the edge termination region 600 arranged between the active area 10 and the outer rim 604. The switchable cells 101 are arranged within and define the active area 10. Each of the switchable cells 101 can include a gate electrode structure and a source region. Furthermore, a source metallization is provided which is in ohmic contact with the source regions of the switchable cells 101 through respective plugs which extends through openings in the gate electrode structure. Furthermore, each switchable cell 101 includes a body region in which an inversion channel can be formed and/or controlled by the voltage applied to the gate electrodes.

In the edge termination region 600, inactive cells 201 are located. The inactive cells 201 are not switchable or are not capable of carrying a load current. Although the inactive cells 201 do not contribute to the load current, they are formed for process reasons and to facilitate the voltage relief in the edge termination area 600.

In situations with high d(Vds)/dt, with Vds being the drain-source voltage, or in case of commutation of the body diode, there is a large (hole-) current contribution from the edge termination region 600. The cells close to the edge termination region 600 collect this current. If the large hole-current is flowing along a n-doped source region, it can trigger the emission of electrons from the n-region into the p-doped body-region. Such an emission would lead to extreme high currents and to destruction of the device. In order to prevent this, the cells at the outer boundary of the active area 10 are often designed without n-doped source-regions so that they cannot contribute to the load current. Hence, these cells 201 are "inactive."

A gate metallization 305 is formed in this embodiment in regions outside the active area 10 and includes a gate ring or gate runner 304 and a gate pad 302.

Semiconductor switching devices can include, but are not restricted to, MOS (metal-oxide-semiconductor) transistors such as MIS (metal-insulator-semiconductor) devices. Accordingly, a MOSFET (metal-oxide-semiconductor field-effect transistor) can include a gate insulator, e.g. an oxide. The gate metallization 305 can include a gate runner structure or gate ring, a gate pad, a gate finger, or any combinations thereof. The gate electrode structure can include highly doped polysilicon. The gate metallization 305 can include at least one of a metal, a metal alloy, and a metal layer stack. According to yet a further modification, the gate metallization 305 can have a higher specific conductivity than the gate electrode structure.

A semiconductor switching device formed in a single chip can have high voltage and/or high current switching capabilities, resulting from the layout of the individual switchable cells 101 and the combination of the switching processes of an ensemble of switchable cells 101 provided on the semiconductor chip. Thereby, such semiconductor power switches can be used in many applications if the switching behaviour of the individual switchable cells can be controlled efficiently.

Inhomogeneous switching can particularly occur for short-duration or short switching processes where predominantly those switchable cells close to gate signal emitters, e.g. close to gate metallization structures are switched. For example, a parasitic current at a gate of a switchable cell resulting from a fast change of a drain-source voltage can generate a short-duration voltage increase at the gate. A gate-source voltage Vgs can amount to a value given by the following equation (1).

$$Vgs \approx Rg*Cgd*dV/dt, \quad (1)$$

wherein Rg is the gate resistance, Cgd is the local gate-drain capacitance, and dV/dt is the voltage change rate. As described above, the gate electrode structure not only forms the actual gate electrodes but also the electrical connection to the gate metallization to distribute the gate signal. Since the gate electrode structure has a given specific resistance ($\Omega/mm^2$), the resistance Rg, which is mainly defined by the gate electrode structure, is higher for switchable cells 101 which are more remote from the gate metallization 305 than for switchable cells 101 which are arranged closer to the gate metallization 305 due to the larger distance from the gate metallization 305. Under certain circumstances, e.g. in an avalanche mode, the different gate resistance Rg renders switchable cells 101 conductive at different points in time so that during this transition time the entire current through the semiconductor device is carried by few switchable cells 101 which were already rendered conductive. This can result in a local overstress of these switchable cells 101. Typically, switchable cells 101 in regions near the gate metallization 305 or edge termination region 600 are rendered conductive first and must therefore carry approximately the entire switching current whereas switchable cells 101 in a more central switchable region of the active area 10 are not or not completely switched, or switched at a later time. This non-uniform behaviour is sometimes referred to as current splitting or formation of current filaments. Formation of current filaments stresses the involved switchable cells and can render the device inoperable.

According to embodiments which can be combined with other embodiments described herein, physical properties of the switchable cells located near the edge termination region 600 and the gate signal emitters 305 can differ from physical properties of the switchable cells 101 located more centrally in the active area 10. Such modification is used to at least partially compensate for the inhomogeneous gate signal penetration. Typically, the switching of switchable cells 101 which are arranged closer to the gate signal emitters 305 are retarded so that the gate signal can penetrate deeper into the active area 10 before the switchable cells 101 close to the gate signal emitter 305 become conductive. This increases the number of switchable cells 101 which are turned on (become conductive) during the short period of time defined by a short period switching signal. Local overstress in the region of the switchable cells 101 rendered conductive can be avoided or at least reduced.

According to an embodiment, the locally varying physical property is the threshold voltage Vth to compensate the varying signal penetration. Switchable cells 101 located closer to the gate metallization 305 can have a threshold voltage Vth which is higher than a threshold voltage Vth of switchable cells 101 located further away from the gate metallization 305. In particular, the threshold voltages of the switchable cells 101 can be in a range from 7 volts to 2 volts, and specifically can be between 4 to 5.5 volt for switchable cells 101 located close to the gate metallization 305, and can be between 3 to 3.5 volt for switchable cells 101 located further away from the gate metallization 305. The difference in the threshold voltage between different sub-regions can be at least 0.2 volt, typically 0.5 volt to 2 volt, for example 1 volt to 2 volts.

Typically, the threshold voltage of the first and second switchable region is below the standard voltage provided by a gate drive to switch-on the semiconductor device.

According to an embodiment which can be combined with other embodiments described herein, the body regions of switchable cells 101 located closer to the gate metallization 305 can have a higher doping concentration (for example an additional p-implantation) than the body regions of switchable cells 101 located further away from the gate metallization 305. For example, the active area 10 can include a plurality of switchable cells 101 each having a source region and a body region, wherein each switchable cell 101 has a specific body implantation concentration, and wherein the body implantation concentration of switchable cells 101 arranged in a peripheral region of the active area 10 is higher than in a central region of the active area 10 which is surrounded by the peripheral region. The peripheral region can be formed next to the edge termination region 600.

According to an embodiment, which can be combined with other embodiments described herein, the structure of the active area 10 (active cell region) can be designed such that the threshold voltages Vth of switchable cells 101 continuously decrease from a sub-region of the active area 10 close to the gate metallization 305 to a center region of the active area 10 further away from the gate metallization 305. According to another embodiment, which can be combined with other embodiments described herein, the active area 10 can be designed such that the threshold voltage Vth of switchable cells 101 decreases step-wise from a sub-region of the active area 10 close to the gate metallization 305 to a center region of the active area 10 further away from the gate metallization 305.

The gate metallization 305 for transferring switching signals from a gate driver circuitry to the switchable cells 101 can be formed in the edge termination region 600. The gate metallization 305 is in ohmic contact with the gate electrode structures of the switchable cells 101. The gate metallization 305 can include a gate ring 304 provided in the outer region of the semiconductor substrate 301, and a gate pad 302. Gate rings 304 are used particularly for large area semiconductor devices having a plurality of switchable cells 101 to connect electrically the gate electrode structures of all switchable cells 101 with a common gate pad structure.

Figure 2:
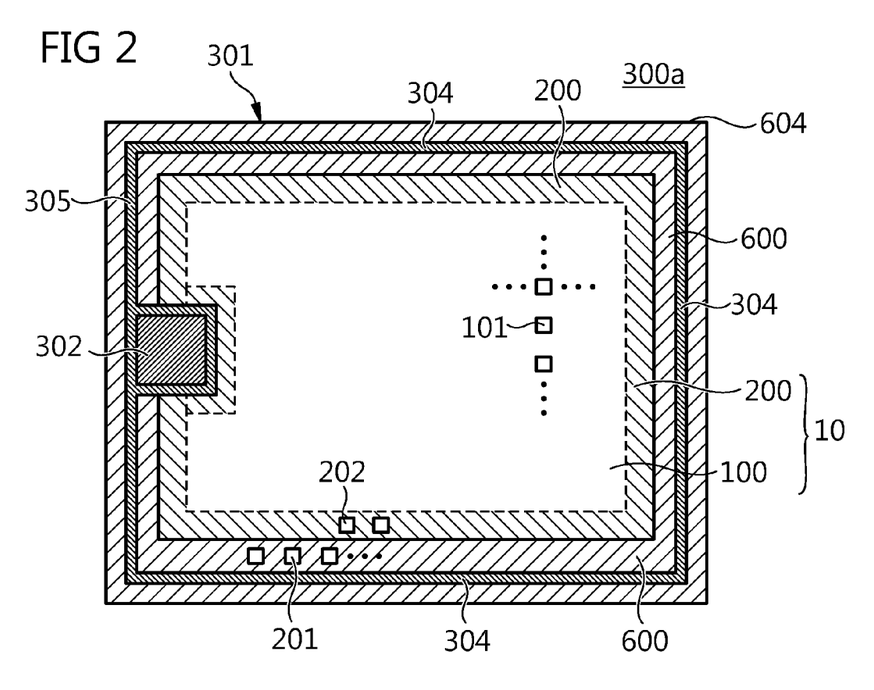
FIG. 2 illustrates a semiconductor switching device having a first switchable region and a second switchable region arranged between the first switchable region and the edge termination region, according to another embodiment.

According to an embodiment, as for example shown in FIG. 2, the active area 10 defined by the switchable cells 101, 202 includes at least a first switchable region 100 having a first threshold and a second switchable region having a second threshold which is different to the first threshold. For example, all switchable cells 101 in the first switchable region 100 have the same threshold voltage which is different to the threshold voltage of all cells 202 in the second switchable region 200.

For example, the second switchable region 200 is arranged between the gate metallization 305 and the first switchable region 100, wherein the second switchable region 200 has a higher threshold voltage than the first switchable region 100.

The active area 10 includes the first switchable region 100, which can be formed by a first switchable region 100 having first switchable cells 101, and at least the second switchable region 200, which can be formed by a second switchable region 200 having second switchable cells 202, wherein the second switchable region 200 at least partially surrounds the first switchable region 100. The first switchable region 100, or the main switchable region, includes main or first switchable cells. 101, whereas the second switchable region 200 includes second switchable cells 202.

As shown in FIG. 2, the second switchable region 200 of a semiconductor switching device 300a is arranged near or adjacent to the edge termination region 600, for example between the first switchable region 100 and the edge termination region 600 which includes the gate metallization 305. The second switchable cells 202 can also be provided, in addition to the different threshold, with a higher gate-drain capacitance than the first switchable cells 101 in the first switchable region 100. Although the second switchable cells 202 receive a switching signal before it is fully distributed to the first switchable cells 101, the increased threshold of the second switchable cells 202 retards the switching of the second switchable cells 202 relative to the first switchable cells 101 so that both the first and the second switchable cells 101, 202 switch approximately at the same time. An optionally increased gate-drain capacitance of the second switchable cells 200 also retards the switching of the second switchable cells 202 relative to the first switchable cells 101.

The active area 10 can therefore include a first switchable region 100 of first switchable cells 101, each first switchable cell 101 having a first specific coverage ratio, and at least a second switchable region 200 of second switchable cells 202, each second switchable cell 202 having a second specific coverage ratio, wherein the second specific coverage ratio is larger than the first specific coverage ratio, and wherein the second switchable region 200 is arranged between the first switchable region 100 and the gate metallization 305.

In the context of the present specification, the term "specific coverage ratio" describes a specific ratio between an area covered by a gate electrode structure in a given region (unit area) and the total area of the given region (unit area). The unit area can be, for example, the area of a single switchable cell. In this case, the specific coverage ratio is defined by the ratio of the area of the gate electrode structure of said cell to the total area of said switchable cell. The specific coverage ratio influences the gate-drain capacitance. Typically, the higher the specific coverage ratio, the higher the gate-drain capacitance for the given region. The given region, however, does not need to correspond to a single switchable cell. The coverage of the gate electrode structure is often referred to as gate polysilicon coverage. A size of a unit cell is, for example indicated in FIG. 6B illustrated by the arrows 101 and 202 for the first and second switchable cells.

A switchable cell 101, 202 has a given layout and can be defined by a single continuous source region when viewed onto the semiconductor substrate. The size of the switchable cells 101, 202 can vary in the active area 10. According to an embodiment, the active area 10 can include switchable cells 101, 202 of different size and/or layout. An example is the so-called stripe layout (see FIG. 11A) where the source regions have the shape of long stripes. As the stripes can be comparably long and can even extend from a first side of the edge termination area 600 to a second side of the edge termination area 600 opposite the first side when viewed onto the semiconductor substrate, a single switchable cell 101, 202 can extend from the first switchable region 100 to the second switchable region 200. In this case, one portion of the switchable cell forms part of the first switchable region 100 while another portion of the switchable cell forms part of the second switchable region 200. Such a switchable cell 101 will then have portions with different threshold voltages. Hence, the boundary between the first and second switchable regions 100, 200 do not need to correlate to the location and boundary of individual switchable cells 101, 202.

In further embodiments, an individual switchable cell completely forms part either of the first switchable region 100 or of the second switchable region 200, or even of a third switchable region if three different switchable regions are formed. In this case, each switchable cell has a given threshold and all switchable cells of a given switchable region has the same threshold with the threshold of the switchable cells of different switchable regions being different from each other.

According to an embodiment, the threshold voltage of the first and second switchable region 100, 200 continuously decreases with increasing distance from the gate metallization 305. Alternatively, the threshold voltages of the first and second switchable region 100, 200 decreases step-wise with increasing distance from the gate metallization 305. A continuous decrease can be obtained, for example, by forming a plurality of different switchable regions each having a given threshold.

Figure 3:
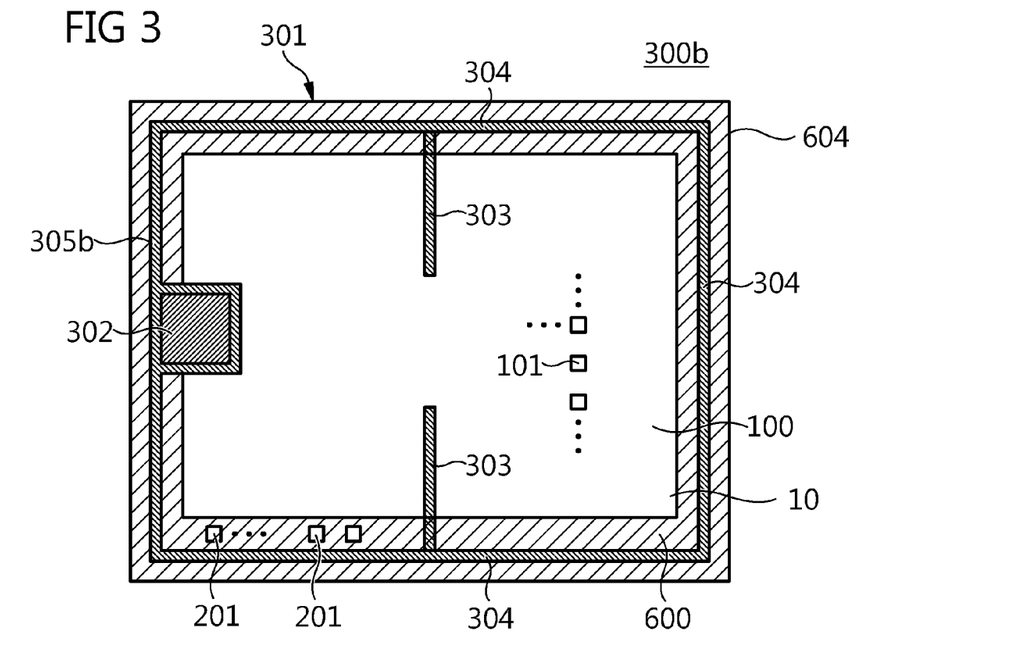
FIG. 3 illustrates a semiconductor switching device provided in a semiconductor substrate, wherein the gate metallization includes gate fingers, according to yet another embodiment.

FIG. 3 illustrates a semiconductor switching device 300b provided on a semiconductor substrate 30 with a modified gate metallization 305b, according to yet another embodiment which can be combined with other embodiments described herein. As shown in FIG. 3, the gate metallization 305b of the semiconductor switching device 300b includes, in addition to the gate metallization 305 shown in FIG. 1, gate fingers 303. The gate metallization 305b includes the gate ring 304, the gate pad 302, and the gate fingers 303. Two gate fingers 303 are shown in FIG. 3. The number of the gate fingers 303 is not restricted to two and can be three, four, five, or even more. The gate fingers 303 transfer the switching signal more efficiently into the main switchable region 100. The gate signal emitter formed by the gate metallization 305b extends closer to main switchable cells 101 as compared to the arrangement shown in FIG. 1.

Figure 4:
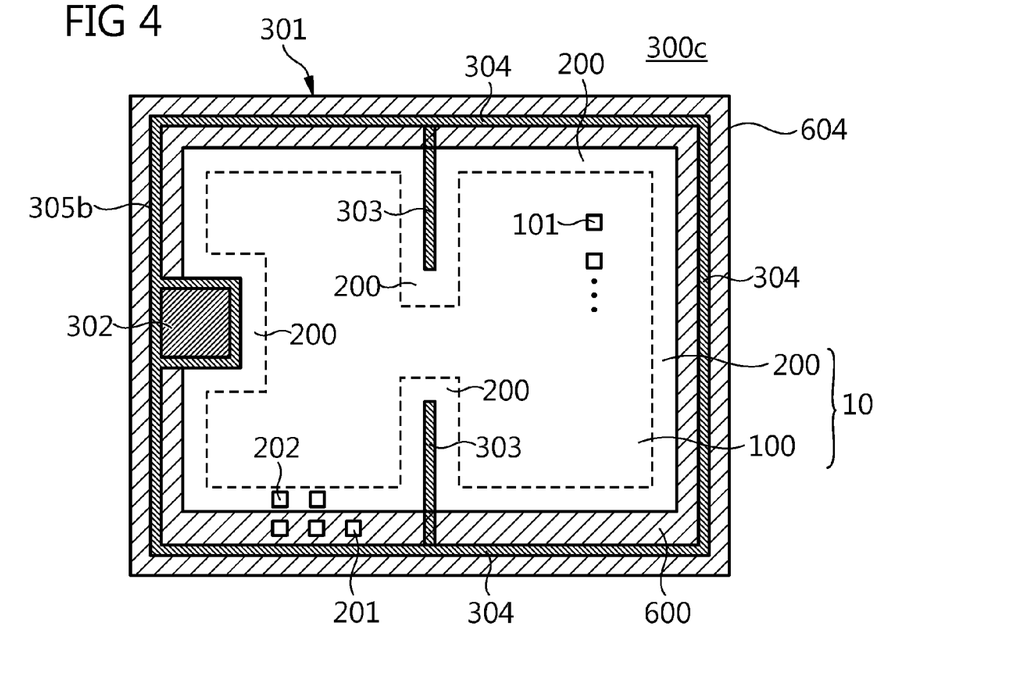
FIG. 4 is a schematic drawing of the semiconductor switching device shown in FIG. 3, wherein a second switchable region is provided close to the gate metallization, according to yet another embodiment.

FIG. 4 is a schematic drawing of the semiconductor switching device 300c having an additional second switchable region 200 which is provided close to the gate metallization 305b. Since the gate metallization 305b includes gate fingers 303 extending deeply into the active area 10, the second switchable region 200 also extends deeply in the active area 10 and surrounds the gate fingers 303. As best illustrated in FIG. 4, the second switchable region 200 is arranged between the first switchable region 100 and the gate metallization 305 also in the regions where the gate fingers 303 are formed since the switchable cells 202 arranged closer to the gate fingers 303, i.e. which have a smaller distance to the gate fingers 303, would also "see" the gate voltage earlier than switchable cells 101 arranged in a greater distance to the gate fingers 303.

According to embodiments, which can be combined with other embodiments described herein, a ratio of the area of the second switchable region 200 to the total area of the first and second switchable region 100 can be in a range from 5% to 50%, particularly in a range from 10% to 40%. The first switchable region 100 is larger than the second switchable region 200. When the semiconductor device includes three or four switchable regions having different threshold voltages, the first switchable region 100 having the lowest threshold voltage can be larger than the total area of the second to fourth switchable region.

As described above, physical properties of the second switchable cells 202 are adapted to be different from physical properties of the first switchable cells 101 to adapt the switching behaviour for partially compensating of the inhomogeneous gate signal distribution in the active area 10. The adapted physical property can be, for example, the threshold voltage Vth of the respective switchable cells 101, 202.

For locally adapting the threshold voltage Vth, the body regions of the second switchable cells 202 can have a higher p++ implantation than the body regions of the first switchable cells 101 located further away from the gate metallization 305, 305b.

According to an embodiment, each body region includes a channel region next to the gate electrode structure, wherein portions of the channel regions of the switchable cells 101 arranged in the first switchable region 100 have a doping concentration which is lower than the doping concentration of portions of the channel regions of the switchable cells 202 arranged in the second switchable region 200. This can be obtained by an additional body implant into the second switchable region.

The body region and the channel region of the body region are of the same conductivity type but can be of different absolute doping concentration. Alternatively, both can have the same doping concentration.

Typically, the portions of the channel regions of the switchable cells 202 arranged in the second switchable region 200 have a doping concentration which is higher than a doping concentration of the portions of the channel regions of the switchable cells 101 arranged in the first switchable region 100.

According to an embodiment, each body region includes a body contact region (312a in FIG. 6A) having a higher doping concentration than the body region, wherein portions of the body contact regions of the switchable cells 101 arranged in the first switchable region 100 have a doping concentration which is different to a doping concentration of portions of the body contact regions of the switchable cells 202 arranged in the second switchable region 200.

The body contact region is a region of the same conductivity type as the body region but of significantly higher absolute doping concentration to provide a low ohmic contact to the body region. When providing the body contact regions with different doping concentrations, the doping concentration of the channel regions will also change due to out-diffusion of the dopants into the body region. Hence, a higher doping of the body contact region indirectly increases the doping concentration of the channel region.

According to an embodiment, the portions of the body contact regions of the switchable cells 202 arranged in the second switchable region 200 have a doping concentration which is higher than a doping concentration of the portions of the body contact regions of the switchable cells 101 arranged in the first switchable region 100.

Figure 9:
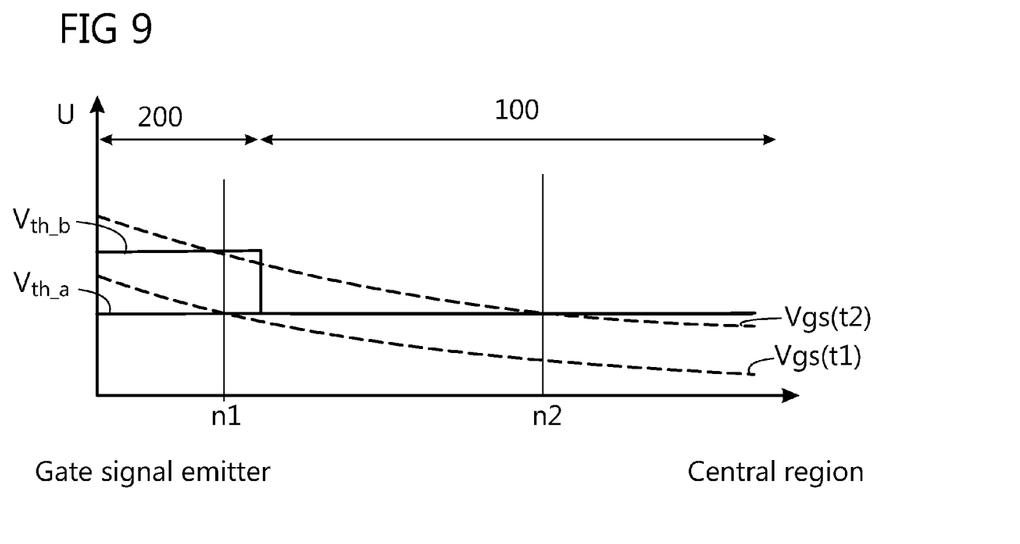
FIG. 9 illustrates the switching behavior of a semiconductor device according to an embodiment.

FIG. 9 illustrates the switching behaviour of a semiconductor device having two cells regions with different threshold voltage according to an embodiment. The threshold voltage of the first switchable cells 101 corresponds to Vth_a while the threshold voltage of the second switchable cells 202 corresponds to Vth_b. Hence, the switchable cells 202 in the second switchable region 200 have a higher threshold voltage than the switchable cells 101 in the first switchable region 100. For comparison, the threshold voltage Vth_a of a device with a constant threshold voltage throughout the active area is also shown. The abscissa indicates the geometrical distance of the cells from the gate metallization.

When a voltage signal is applied to the gate signal emitter (gate metallization 305 or 305b), the voltage signal is not immediately distributed to all switchable cells. A schematic voltage distribution Vgs(t1) at a time t1 and at a later time t2 as Vgs(t2) is indicated in FIG. 9. For a given cell to be switched, the local voltage at the respective gate of the switchable cell needs to be at least equal to the threshold voltage of this cell. For t1 and a device having a constant threshold voltage Vth_a for all cells, the number of cells which are rendered conductive at t1 is n1. The number n1 represents here the number of all cells between the gate signal emitter and the location where the local voltage U is equal to or higher the threshold voltage Vth_a. Hence, few cells are already conductive in the device having a constant threshold voltage so that these cells must carry the full load current. Different thereto, when the threshold voltage Vth_b is locally raised in the second switchable region 200 while keeping the threshold voltage in the first switchable region 100 at low level, the number of cells which are rendered conductive at time t1 is zero as Vth is less than the respective local threshold for all switchable regions 100, 200.

For time t2, the number of conductive cells of the device with constant threshold voltage Vth_a is n2. Since the local voltage U in the second switchable region 200 is also higher than Vth_b, the number of cells of the device with different threshold voltage is also n2. The main difference is that for a device with a locally increased threshold voltage Vth_b in the second switchable region 200, the cells in the second switchable region 200 become conductive at a later stage.

As explained further below, the number switchable regions with different threshold voltage can be larger than two. This allows for a better "approximation" of the gate voltage signal distribution, so that the number of cells which become conductive at the same time or within a very short duration increases.

According to an embodiment, which can be combined with other embodiments described herein, the active area 10 includes a first switchable region 100 of first switchable cells 101, each first switchable cell 101 having a first threshold voltage, and at least a second switchable region 200 of second switchable cells 202, each second switchable cell 202 having a second threshold voltage, wherein the second threshold voltage is larger than the first threshold voltage, and wherein the second switchable region 200 is arranged between the first switchable region 100 and the gate metallization 305, 305b.

According to an embodiment, the number of switchable regions 100, 200 can be increased to adapt it to the expected critical profile, which depends on the signal distribution properties of the technology such as layout geometry and gate material resistance.

According to yet another embodiment, an outer ring region of the active area 10 can include switchable cells having a threshold voltage higher than a threshold voltage of switchable cells located in a central region of the active area 10, wherein the outer ring region of the active area provides a boundary between a central region of the active area and the edge termination region.

Alternatively, the gate metallization can be arranged in a central position of the semiconductor device disposed from the outer rim. In this case, the second switchable region can surround, at least partially, the central gate metallization, and the first switchable region can surround, at least partially, the second switchable region, wherein the second switchable region has a higher specific threshold than the first switchable region.

Detailed structures of switchable cells are described herein below with reference to FIG. 5.

Figure 5:
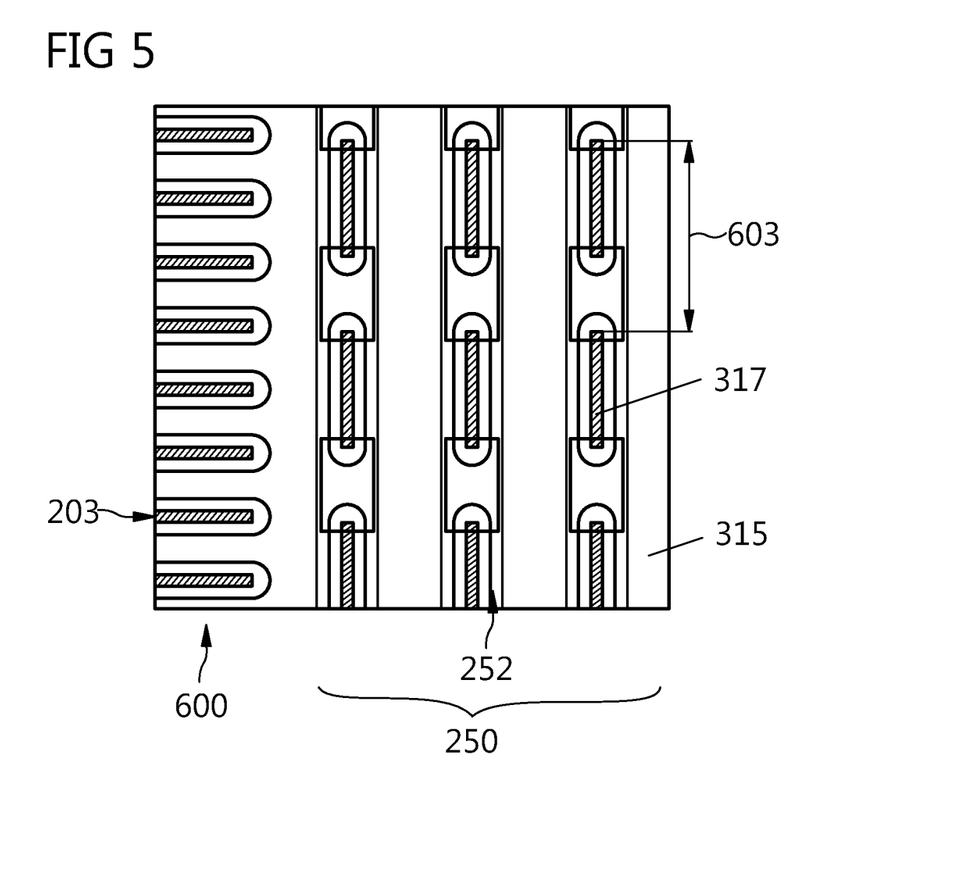
FIG. 5 is a schematic view of layout of a switchable cell at or near of the edge termination region, according to an embodiment.

A method of manufacturing a semiconductor switching device 300 can be illustrated with respect to the cell layout depicted in FIG. 5. The method includes providing a semiconductor substrate 300 having an outer rim 604, an active area 10, and an edge termination region 600 arranged between the active area 10 and the outer rim 604. A plurality of switchable cells 101 is formed in the active area 10, wherein each of the switchable cells 101 includes a gate electrode structure and a source region. A source metallization is formed in ohmic contact with the source regions of the switchable cells 101.

Furthermore, a gate metallization 305 is formed in ohmic contact with the gate electrode structures of the switchable cells 101. The threshold voltage Vth of the switchable cells 101 located closer to the gate metallization 305 is set to be higher than the threshold voltage Vth of switchable cells 101 located further away from the gate metallization 305. Tailoring of the threshold voltage Vth can be provided by adjusting implantation dose.

FIG. 5 illustrates a cell structure formed in an outer subregion of the active area 10 which can form, for example, a third switchable region 250. The edge termination region 600 at least partially surrounds the third switchable region 250 of the active area 10. The third switchable region 250 includes third switchable cells 252. The edge termination region 600 includes inactive cells 203. Furthermore, a longitudinal pitch 603 of a cell arrangement of the third switchable cells 252 in the third switchable region 250 of the active area is depicted.

To implant dopants into the body regions or channel regions of the second switchable cells 202 selective with respect to the first switchable cells 101, an auxiliary implantation mask can be used which can have a coverage corresponding to the extent of the first switchable region 100 in FIG. 2 or FIG. 4. The second switchable region 200 thus remains uncovered and additional dopants can be implanted there to increase the doping concentrations of the body regions, channel regions, or body contact regions in the second switchable region 200 selective to the first switchable region 100.

Figure 10A:
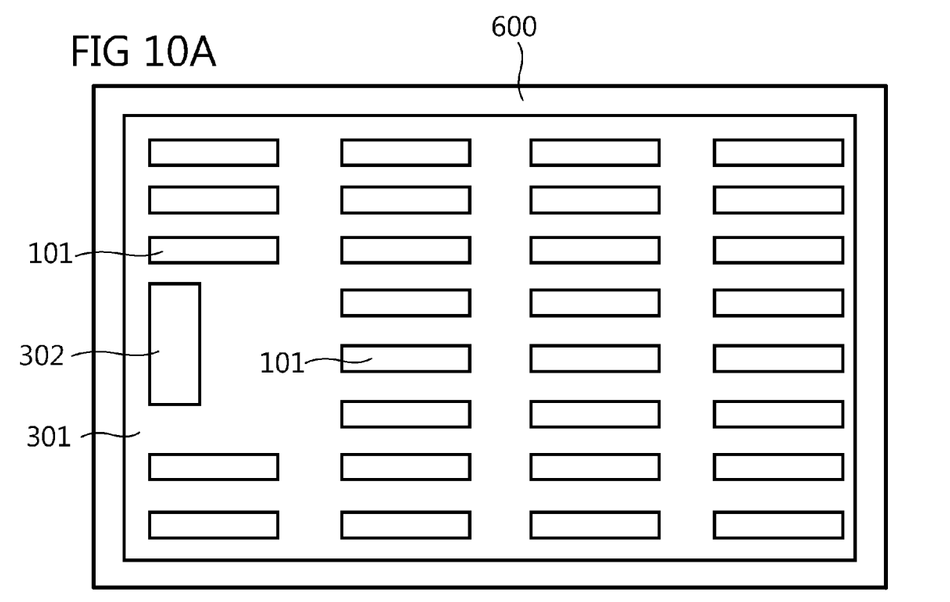
FIGS. 10A and 10B illustrate a body implantation process according to an embodiment.
Figure 10B:
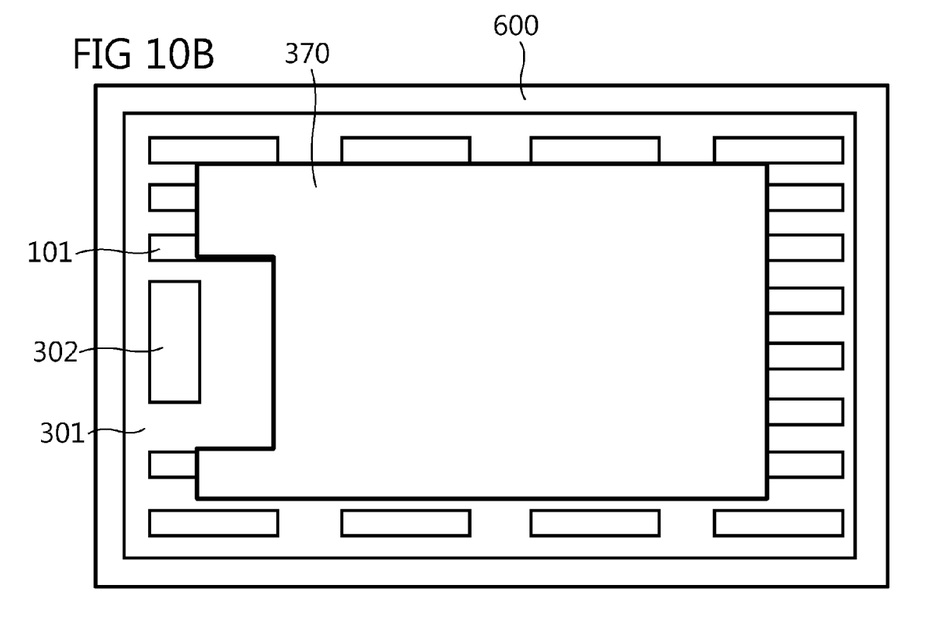

A process using an additional body implant is illustrated in FIGS. 10A and 10B. A first body implant is carried out globally without any auxiliary implantation mask as illustrated in FIG. 10A. FIG. 10B illustrates a second body implant using an auxiliary implantation mask 370 which covers the first switchable region 100. As shown in FIGS. 10A and 10B, the cell layout is a bar layout, and the auxiliary implantation mask 370 covers, in a peripheral region of the semiconductor substrate 301, only portions of the switchable cells 101 while completely covering the central region of the semiconductor substrate 301. Hence, only the uncovered portions of the switchable cells 101 which receives a second body implant forms the second switchable region 200.

Figure 11A:
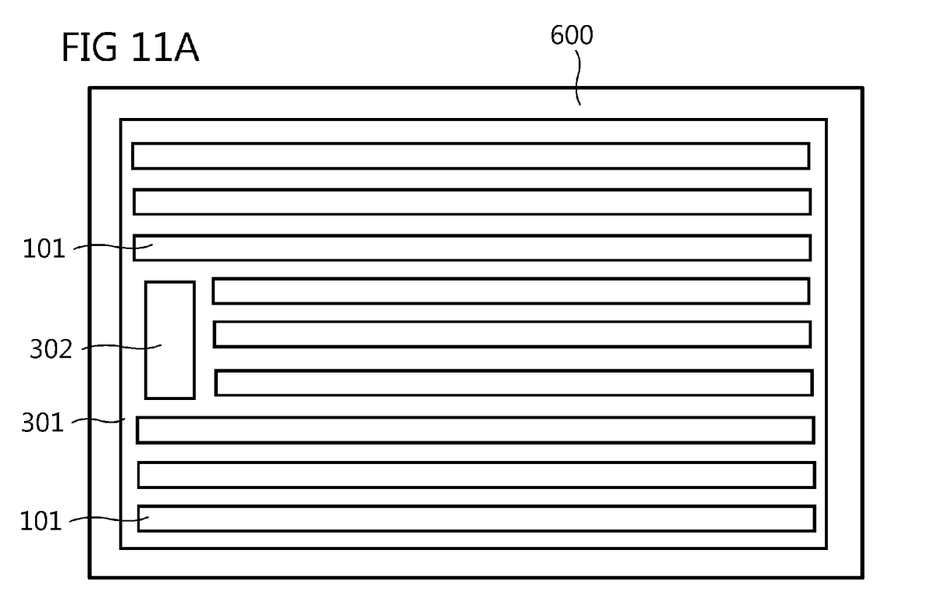
FIGS. 11A and 11B illustrate a body implantation process according to an embodiment.
Figure 11B:
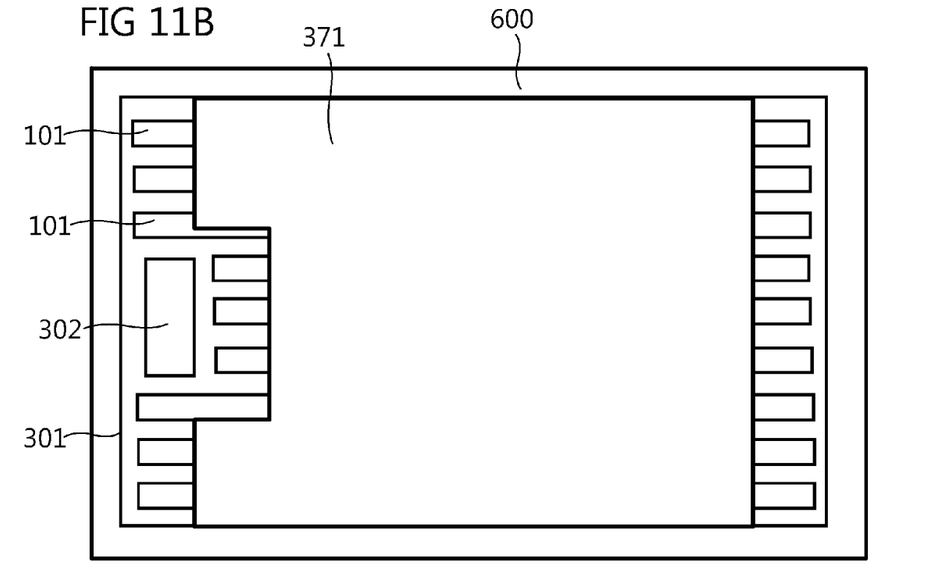

FIGS. 11A and 11B illustrate two body implants for a semiconductor device having switchable cells 101 of the stripe layout. The second body implant is carried out using an auxiliary implantation mask 371 which covers the first switchable region 100. The switchable cells 101 are therefore only covered in the central region which later forms the first switchable region 100.

According to an embodiment, a method of manufacturing a semiconductor switching device can include providing a semiconductor substrate having an outer rim, an active area, and an edge termination region arranged between the active area and the outer rim; forming a plurality of switchable cells in the active area, wherein each of the switchable cells includes a body region, a gate electrode structure, and a source region, wherein the active area defined by the switchable cells includes at least a first switchable region having a first threshold and a second switchable region having a second threshold which is different to the first threshold; forming a source metallization in ohmic contact with the source regions of the switchable cells; and forming a gate metallization in ohmic contact with the gate electrode structures of the switchable cells.

According to embodiments, which can be combined with other embodiments described herein, the gate metallization can include a gate electrode structure such as an electrically conductive structure selected from the group consisting of a gate runner structure, a gate pad, a gate ring, a gate finger, or any combinations thereof. In particular, the plurality of switchable cells can include a transistor selected from the group consisting of a MOSFET, a MISFET, an IGBT, a SJFET (Superjunction FET), and any combinations thereof. A SJFET is a compensation device.

Figure 6A:
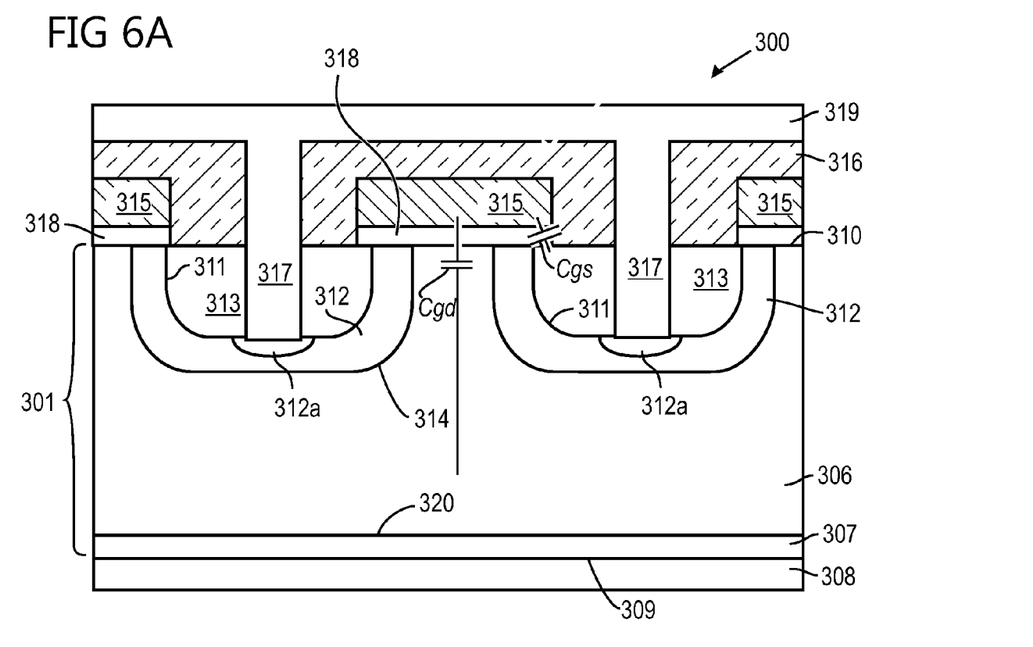
FIG. 6A is a side-sectional view of a portion of an array of switchable cells, according to an embodiment.
Figure 6B:
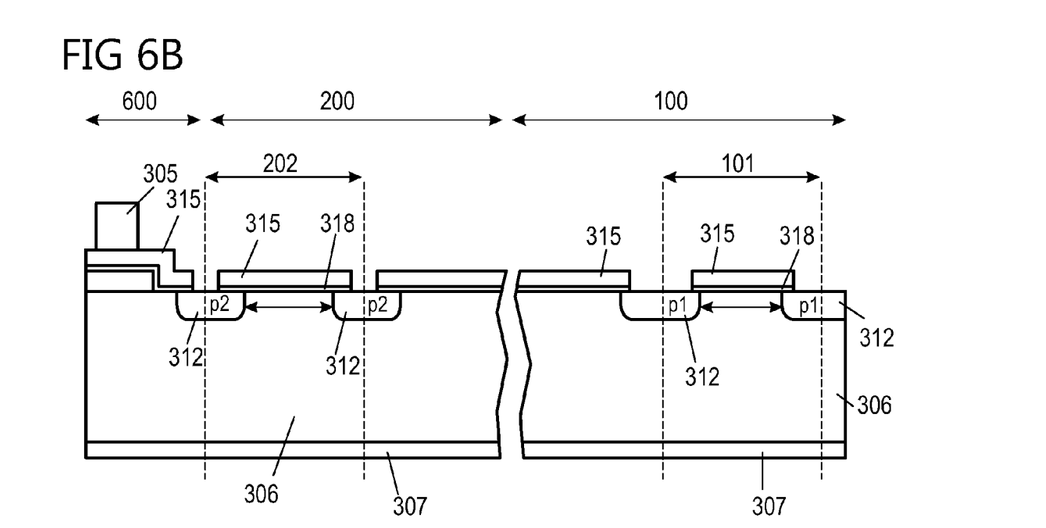
FIG. 6B is a side-sectional view of a portion of an array of switchable cells, according to another embodiment.

FIG. 6A is a cross-sectional view of a portion of a semiconductor device 300, wherein two adjacent switchable cells are illustrated.

The semiconductor substrate 301 has a first, upper side 310 and a second, lower side 309. At the second side 309 a drain region 307 is formed which is electrically connected to a drain metallization 308. A first pn-junction 314 is formed between a drift region 306 and a body region 312. A gate electrode structure 315 includes the gate electrodes and forms a gate-source capacitance Cgs and a gate-drain capacitance Cgd. The body region 312 and a source region 313 are electrically connected by source contacts 317 with a source metallization 319 and are therefore at source potential in this embodiment. According to another embodiment, the body region 312 is not electrically connected to the source metallization 319 and thus floating. An area of the gate-source capacitance Cgs assumes the laterally outer portions of the gate electrode 315, e.g. the area where the gate electrode structure 315 overlaps the source regions 313 and the field-free portions of the body regions 312, in which no space-charge region is formed. The field-free portions of the body regions 312 and the source regions 313 form the counter electrode of the gate-source-capacitance Cgs.

On the other hand, the central portion of the gate electrode structure 315 forms the gate-drain capacitance Cgd. The counter electrode is formed here by the field-free portions of the drift region 306, e.g. the portions of the drift region 306 which are below the space-charge region. The "capacitor dielectric layer" of the gate-drain capacitance Cgd is formed by a dielectric dielectric layer 318 and the space-charge region.

To provide a good ohmic contact between the source contacts 317 and the body regions 312, respective body contact regions 312a are formed which have a higher doping concentration than the doping concentration of the body regions 312.

As shown in FIG. 6A, the gate-drain capacitance Cgd can be dependent on the specific coverage ratio between the area of the gate electrode structure 315 and the area of the semiconductor substrate. It is noted here that the active area includes both the area of the first switchable region 100 and the area of the second switchable region (see, e.g. FIGS. 2 and 4). Herein, the specific coverage ratio of the gate electrode structure 315 can be higher in regions of the active area which are located closer to the gate metallization than in regions of the active area which are located further away from the gate metallization.

This is schematically illustrated in FIG. 6B which shows a cross-section through a semiconductor device according to an embodiment. FIG. 6B shows the active area with the first switchable region 100, which is the central switchable region of the active area, and the second switchable region 200 of the active area formed by the first and second switchable region 100, 200. The second switchable region 200 surrounds the first switchable region 100.

As can be seen in FIG. 6B, the gate electrode structure 315 extends from the first switchable region 100 to the edge termination region 600. The gate metallization 305, specifically a gate ring, is formed in the edge termination region 600 on and in contact with the gate electrode structure 315. Additional gate fingers can also be formed in contact with the gate electrode structure 315 to extend from the gate ring 305 into the second switchable region 200.

The different p-implantation is also shown in FIG. 6B indicated by the doping concentration p1 and p2 of the respective body regions 312. The doping concentration p2 of the body regions 312 in the second switchable region 200 is higher than the doping concentration p1 of the body region 312 in the first switchable region 100 to locally increase the threshold voltage Vth in the second switchable region 200.

Figure 7:
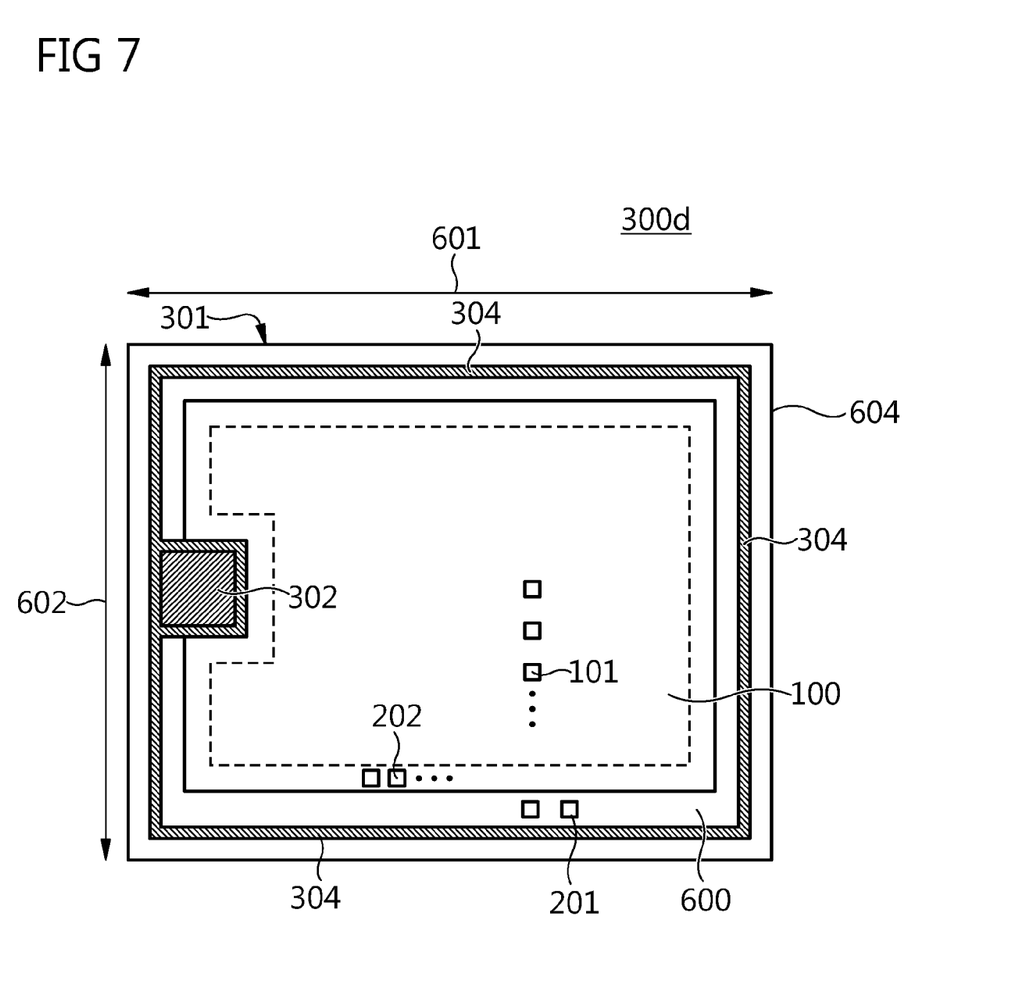
FIG. 7 illustrates a semiconductor switching device having a first switchable region and a second switchable region arranged between the first switchable region and an edge termination region, according to another embodiment.

FIG. 7 illustrates a semiconductor switching device 300d having a first switchable region 100 and a second switchable region 200 arranged between the first switchable region 100 and the edge termination region 600, according to an embodiment. Specifically, the active area 10 can include the first switchable region 100 having first switchable cells 101 and the second switchable region 200 having second switchable cells 202, wherein the second switchable region 200 at least partially surrounds the first switchable region 100. The first switchable region 100, or the main switchable region, includes main or first switchable cells 101, whereas the second switchable region 200 includes sub-region cells 202, or second cells.

As illustrated in FIG. 7, the second switchable region 200 is arranged near or adjacent to the edge termination region 600. As the gate metallization 305 formed by the gate ring 304 and the gate pad 302 is arranged within the edge termination region 600, switchable cells 202 arranged in the second switchable region 200 can receive switching signals in a shorter time period than the first switchable cells 101 located in the main switchable region 100. A physical dimension of the semiconductor substrate can be defined by a substrate length 601 and by a substrate width 602. The substrate length can be in a range from 5 mm to 15 mm, and typically amounts to approximately 10 mm. The substrate width can be in a range from 4 mm to 10 mm, and typically amounts to approximately 7 mm.

Figure 8:
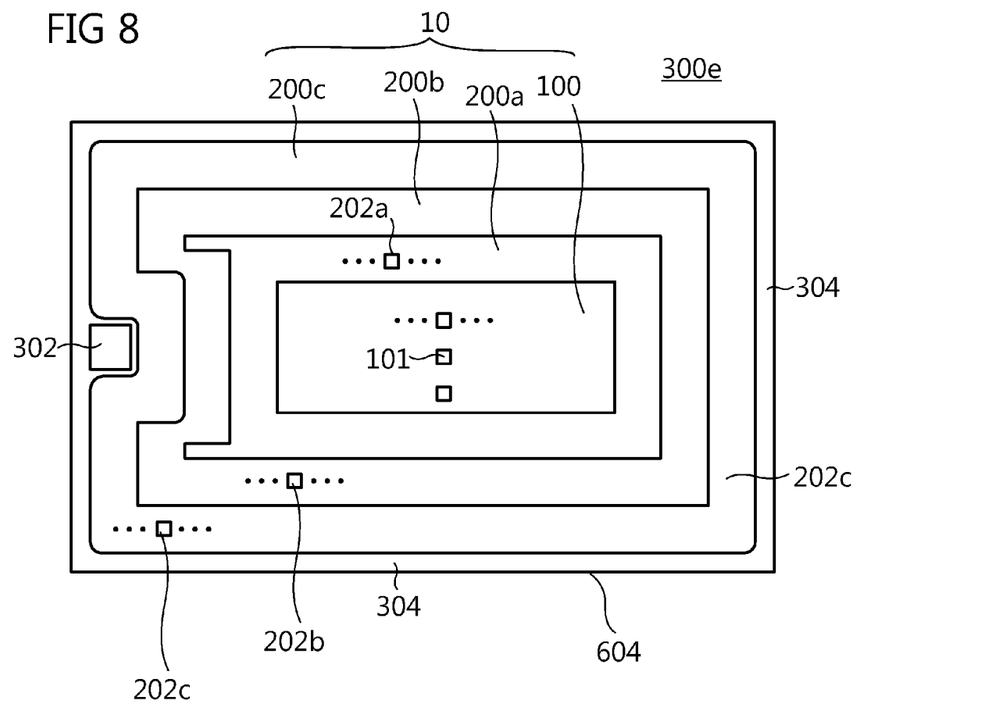
FIG. 8 illustrates a semiconductor switching device having a first switchable region, a second switchable region, a third switchable region, and a fourth switchable region, according to yet another embodiment.

FIG. 8 illustrates a semiconductor switching device 300e having a first switchable region 100 and more than one second switchable regions 200a, 200b arranged between the first cell 100 region and an edge termination region 600, according to yet another embodiment which can be combined with embodiments described herein.

In the arrangement shown in FIG. 8, the first switchable region 100 of the active area 10 can include switchable cells 101 having a threshold voltage Vth of approximately 2.8 Volts. According to an embodiment, at least four switchable regions or switchable regions 100, 200a, 200b, 200c can be provided. Herein, the second switchable region 200a of the active area 10 at least partially surrounds the first switchable region 100 and can include switchable cells 202a having a threshold voltage Vth of approximately 3.2 Volts. The third switchable region 200b of the active area 10 at least partially surrounds the second switchable region 200a and can include switchable cells 202b having a threshold voltage Vth of approximately 3.8 Volts. Furthermore, the fourth switchable region 200c of the active area 10 at least partially surrounds the third switchable region 200b and can include switchable cells 202c having a threshold voltage Vth of approximately 4.4 Volts. Herein, a body implantation dose of switchable cells located closer to the gate metallization 305 can be higher than a body implantation dose of switchable cells located further away from the gate metallization. Specifically, the body implantation dose can be adjusted by adjusting an implantation opening during the cell formation process. In particular, the body region of switchable cells located closer to the gate metallization 305 can have a higher p++ implantation than the body region of switchable cells located further away from the gate metallization.

For varying the threshold voltage, an additional implantation step or steps can be performed. For example, the body implantation can be carried out globally, e.g. for the first and the second switchable region 100, 200, while an additional p-implantation is carried out for the second switchable region 200 only. For the additional p-implantation, an extra mask can be used which covers the first switchable region 100.

To provide the switchable regions 100, 202a, 202b, 202c with different threshold voltages, a first or global body implantation is carried out. Other regions of the device can be protected by a body implantation mask. Then a first auxiliary mask is formed on the body implantation mask. The first auxiliary mask has a size and shape corresponding to the first switchable region 100 as illustrated in FIG. 8. With the first auxiliary mask in place, a second body implantation is carried out which introduces dopants into all body regions except the body regions of the first switchable region 100. FIGS. 10A, 10B, 11A, and 11B exemplarily illustrate the use of one auxiliary mask. Additional auxiliary masks with adapted size can be used when three or more switchable regions are formed.

Then a second auxiliary mask is formed on the first auxiliary mask, or when the first auxiliary mask has been removed after the second body implantation, on the body implantation mask. The second auxiliary mask has a size and shape corresponding to the second switchable region 202a and the first switchable region 100 as illustrated in FIG. 8 to cover both the first and the second switchable region 100, 202a. With the second auxiliary mask in place, a third implantation is carried out which introduces dopants into all body regions except the body regions of the first switchable region 100 and the second switchable region 202a.

Then a third auxiliary mask is formed on the second auxiliary mask, or when the second auxiliary mask has been removed after the third body implantation, on the body implantation mask. The third auxiliary mask has a size and shape corresponding to the third switchable region 202b, the second switchable region 202a and the first switchable region 100 as illustrated in FIG. 8, to cover all three switchable regions 100, 202a, 202b. With the third auxiliary mask in place, a fourth implantation is carried out which introduces dopants into all body regions except the body regions of the first switchable region 100, the second switchable region 202a, and the third switchable region 202b.

The body regions of the fourth switchable region 202c thus receives four body implantations, the body regions of the third switchable region 202b receives three body implantations, the body regions of the second switchable region 202a receives two body implantations, while the body regions of the first switchable region 100 receives one body implantation. A stepwise increase of the doping concentration of the body regions from the first switchable region 100 to the fourth switchable region 202c is thus obtainable.

For illustration purposes, when having a first switchable region 100 and a second switchable region, the global p-implantation process for forming the body regions in the first and second switchable regions 100, 200 of the active area 10 introduces a doping concentration between $5*10^{16}/cm^3$ and $1.5*10^{17}/cm^3$, and particularly between $1*10^{17}/cm^3$ and $1.25*10^{17}/cm^3$. For the additional p-implantation process, which implants dopants only in the second switchable region 200, a dosage between $1*10^{17}/cm^3$ and $4*10^{17}/cm^3$, and particularly between $1.5*10^{17}/cm^3$ and $2.5*10^{17}/cm^3$ can be used.

When three or more different switchable regions are formed, the number of additional p-implantation processes and the implantation dosage are adapted accordingly.

Furthermore, the active area 10 can include a first switchable region of first switchable cells, each first switchable cell having a first threshold voltage, and a second switchable region of second switchable cells, each second switchable cell having a second threshold voltage, and at least a third switchable region of third switchable cells, each third switchable cell having a third threshold voltage, wherein the third threshold voltage is larger than the second threshold voltage, the second threshold voltage is larger than the first threshold voltage, and the second switchable region is arranged between the first switchable region and the third switchable region.

In view of the above, according to an embodiment, a semiconductor substrate includes a plurality of switchable cells defining an active area of the semiconductor device, an outer rim, and an edge termination region arranged between switchable cells and the outer rim. Each of the switchable cells includes a body region, a gate electrode structure and a source region. The body region has a body contact region having a higher doping concentration than the body region. A source metallization is in ohmic contact with the source regions and the body contact regions of the switchable cells. A gate metallization is in ohmic contact with the gate electrode structures of the switchable cells. The active area defined by the switchable cells includes at least a first switchable region and a second switchable region different to the first switchable regions, wherein portions of the body contact regions of switchable cells arranged in the first switchable region have a doping concentration which is different to portions of the body contact regions of switchable cells arranged in the second switchable region.

Spatially relative terms such as "under," "below," "lower," "over," "upper" and the like, are used for ease of description to explain the positioning of one element relative to a second element. These terms are intended to encompass different orientations of the device in addition to different orientations than those depicted in the Figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising a plurality of switchable cells defining an active area of the semiconductor device, an outer rim, and an edge termination region arranged between the switchable cells and the outer rim, each of the switchable cells comprising a body region, a gate electrode structure and a source region; a source metallization in ohmic contact with the respective source region of the switchable cells; and a gate metallization in ohmic contact with the respective gate electrode structure of the switchable cells;
wherein the active area defined by the switchable cells comprises at least a first switchable region and at least a second switchable region, wherein the switchable cells of the first switchable region have a first threshold voltage, and wherein the switchable cells of the second switchable region have a second threshold voltage which is higher than the first threshold voltage, and wherein an area occupied by the first switchable region is larger than an area occupied by the second switchable region.

2. The semiconductor device of claim 1, wherein the second switchable region is arranged between the gate metallization and the first switchable region.

3. The semiconductor device of claim 2, wherein the threshold voltages of the first and second switchable region continuously decreases with increasing distance from the gate metallization.

4. The semiconductor device of claim 2, wherein the threshold voltages of the first and second switchable region decreases step-wise with increasing distance from the gate metallization.

5. The semiconductor device of claim 1, wherein the threshold voltage of the first switchable region is between 3 to 3.5 volt and the threshold voltage of the second switchable region is between 4 to 5.5 volt.

6. The semiconductor device of claim 1, wherein the plurality of switchable cells comprises at least one transistor selected from the group consisting of a MOSFET, a MISFET, an IGBT, a SJFET, and any combinations thereof.

7. The semiconductor device of claim 1, wherein the area occupied by the second switchable region, when seen in a plan view onto the semiconductor substrate, is between 5% and 50% of the total area occupied by the first and second switchable region.

8. The semiconductor device of claim 1, wherein each body region comprises a body contact region having a higher doping concentration than the remaining body region, wherein portions of the body contact regions of the switchable cells arranged in the first switchable region have a doping concentration which is lower than a doping concentration of the body contact regions of the switchable cells arranged in the second switchable region.

9. The semiconductor device of claim 8, wherein the doping concentration of the body contact regions of the first and second switchable region decreases step-wise with increasing distance from the gate metallization.

10. The semiconductor device of claim 8, wherein each body region comprises a body contact region having a higher doping concentration than the remaining body region, wherein portions of the body contact regions of the switchable cells arranged in the second switchable region have an implantation width which is larger than an implantation width of portions of the body contact regions of the switchable cells arranged in the first switchable region.

11. The semiconductor device of claim 10, wherein the width of the implantation of the body contact regions of the first and second switchable regions decreases step-wise with increasing distance from the gate metallization.

12. The semiconductor device of claim 1, wherein each body region comprises a channel region next to the gate electrode structure, wherein portions of the channel regions of the switchable cells arranged in the first switchable region have a doping concentration which is lower than a doping concentration of portions of the channel regions of the switchable cells arranged in the second switchable region.

13. The semiconductor device of claim 12, wherein the doping concentration of the body regions of the first and second switchable regions decreases step-wise with increasing distance from the gate metallization.

14. The semiconductor device of claim 1, wherein the first switchable region forms a central region of the active area, and wherein the first switchable region is at least partially surrounded by the second switchable region.

15. The semiconductor device of claim 1, wherein an outer ring region of the active area comprises switchable cells having a higher threshold voltage than switchable cells located in a central region of the active area, wherein the outer ring region of the active area provides a boundary between the central region of the active area and the edge termination region.

16. A semiconductor device, comprising:
a semiconductor substrate comprising a plurality of switchable cells defining an active area of the semiconductor device, an outer rim, and an edge termination region arranged between switchable cells and the outer rim, each of the switchable cells comprising a body region, a gate electrode structure and a source region, the body region comprising a channel region next to the gate electrode structure; a source metallization in ohmic contact with the respective source region of the switchable cells; and
a gate metallization in ohmic contact with the respective gate electrode structure of the switchable cells;
wherein the active area defined by the switchable cells comprises at least a first switchable region and a second switchable region different to the first switchable region, wherein portions of the channel regions adjacent to the body regions of the switchable cells arranged in the first switchable region have a doping concentration which is lower than a doping concentration of portions of the channel regions adjacent to the body regions of the switchable cells arranged in the second switchable region.

17. The semiconductor device of claim 16, wherein the second switchable region is arranged between the gate metallization and the first switchable region.

18. The semiconductor device of claim 16, wherein the doping concentration of the body regions of the first and second switchable regions decreases step-wise with increasing distance from the gate metallization.

19. The semiconductor device of claim 16, wherein the doping concentration of the portions of the channel regions of the switchable cells arranged in the second switchable region is between $1.5*10^{17}/cm^3$ and $2.5*10^{17}/cm^3$, and wherein the doping concentration of the portions of the channel regions of the switchable cells arranged in the first switchable region is between $1*10^{17}/cm^3$ and $1.25*10^{17}/cm^3$.

* * * * *